(12) United States Patent
Zhang et al.

(10) Patent No.: US 9,209,305 B1
(45) Date of Patent: Dec. 8, 2015

(54) BACKSIDE SOURCE-DRAIN CONTACT FOR INTEGRATED CIRCUIT TRANSISTOR DEVICES AND METHOD OF MAKING SAME

(71) Applicant: STMicroelectronics, Inc., Coppell, TX (US)

(72) Inventors: John Hongguang Zhang, Fishkill, NY (US); Walter Kleemeier, Albany, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/298,000

(22) Filed: Jun. 6, 2014

(51) Int. Cl.
  *H01L 29/786* (2006.01)
  *H01L 27/12* (2006.01)

(52) U.S. Cl.
  CPC ...... *H01L 29/78603* (2013.01); *H01L 27/1203* (2013.01)

(58) Field of Classification Search
  CPC ................................................ H01L 29/78603
  USPC .................................................. 257/404, 347
  See application file for complete search history.

(56) References Cited

U.S. PATENT DOCUMENTS

| 8,110,877 | B2 | 2/2012 | Mukherjee et al. | |
| 8,617,973 | B2 | 12/2013 | Xie et al. | |
| 8,679,909 | B2 | 3/2014 | Xie et al. | |
| 2007/0029611 | A1* | 2/2007 | Phan et al. | 257/347 |
| 2010/0019385 | A1* | 1/2010 | Bartley et al. | 257/741 |

* cited by examiner

*Primary Examiner* — Anthony Ho
(74) *Attorney, Agent, or Firm* — Gardere Wynne Sewell LLP

(57) ABSTRACT

An integrated circuit transistor is formed on and in a substrate. A trench in the substrate is at least partially filed with a metal material to form a source (or drain) contact buried in the substrate. The substrate further includes a source (or drain) region epitaxially grown above the source (or drain) contact. The substrate further includes a channel region adjacent to the source (or drain) region. A gate dielectric is provided on top of the channel region and a gate electrode is provided on top of the gate dielectric. The substrate is preferably of the silicon on insulator (SOI) type.

33 Claims, 23 Drawing Sheets

US 9,209,305 B1

BACKSIDE SOURCE-DRAIN CONTACT FOR INTEGRATED CIRCUIT TRANSISTOR DEVICES AND METHOD OF MAKING SAME

FIELD OF THE INVENTION

The present disclosure generally relates to integrated circuits and, in particular, to integrated circuits with transistors formed with a small pitch.

BACKGROUND

Those skilled in the art understand that integrated circuit dimensions are becoming increasingly smaller. As the technology nodes for fabrication continue to scale down, it is becoming increasingly more difficult to prevent short channel effects (SCE) in the transistor and reduce the resistance of metal lines in order to reach required performance characteristics for device speed performance. Additionally, the reduced pitch of the transistor layout complicates the ability to make electrical contact to the source and drain regions from above the transistor.

It is known in the art to fabricate transistors on an integrated circuit substrate which is of the Silicon-on-Insulator (SOI) type (as opposed to the use of bulk semiconductor substrates). An SOI substrate is formed of a top semiconductor (for example, silicon or silicon-germanium) layer over an insulating (for example, silicon dioxide) layer over a bottom semiconductor (for example, silicon) substrate layer. The source, drain and channel of the transistor are formed in the top semiconductor layer. The resulting transistor is electrically insulated from the lower part of the substrate by the intermediate layer of insulating material. This structure advantageously reduces concerns with leakage current.

Further substrate development has reduced the thickness of the intervening insulating layer to about 50 nm to produce a substrate for use in transistor fabrication that is referred to as an extremely thin silicon on insulator (ETSOI) substrate. Still further substrate development has reduced the thicknesses of all substrate layers to produce a substrate for use in transistor fabrication that is referred to an ultra-thin body and buried oxide (UTBB) substrate where the thickness of the intervening insulating layer is about 25 nm (or less) and the thickness of the top semiconductor layer is about 5 nm to 10 nm. All of these substrates may more generally be referred to as SOI substrates.

Notwithstanding the recognized advantages of using SOI substrates for transistor fabrication, it is noted that some variation in layer thickness can occur, especially in the case of the ETSOI substrate and the UTBB substrate. This variation in layer thickness can lead to variability in both threshold voltage (Vt) roll-off and sub-threshold voltage slope for transistors fabricated on and in the substrate. This variability is especially a concern for transistors having gate lengths of less than about 25 nm.

There is accordingly a need in the art for an alternative means to make a transistor supported by a SOI-type substrate.

SUMMARY

In an embodiment, an integrated circuit transistor comprises: a substrate including an insulating layer and an overlying semiconductor layer, the substrate including a trench extending into the insulating layer; a metal material at least partially filling the trench in the insulating layer to form a source contact buried in the substrate; a source region formed by the overlying semiconductor layer, said source region lying on top of and in electrical contact with the source contact; a channel region in the overlying semiconductor layer adjacent the source region; a gate dielectric on top of the channel region; and a gate electrode on top of the gate dielectric.

In an embodiment, a method comprising: forming a trench in a substrate; at least partially filing said trench with a metal material form a source contact buried in the substrate; epitaxially growing a source region over the source contact; epitaxially growing a channel region located adjacent the source region; providing a gate dielectric on top of the channel region; and forming a gate electrode on the gate dielectric.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE DRAWINGS

Figure 1:
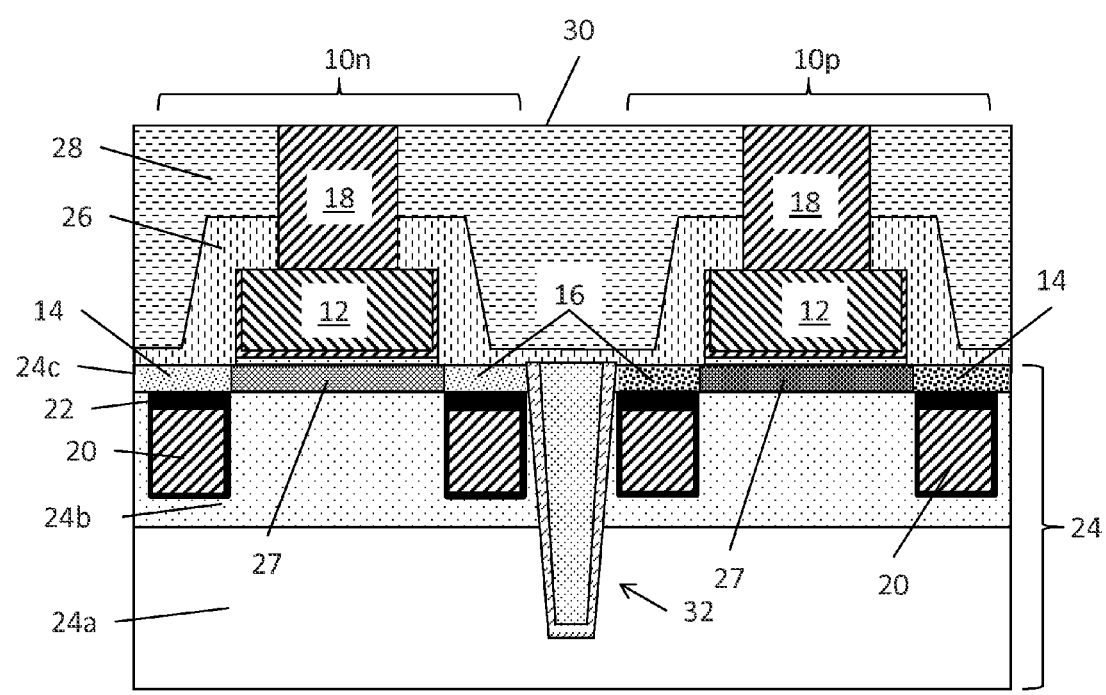
FIG. 1 is a cross-sectional diagram of a plurality of transistors which utilize a backside contact made to the transistor source-drain regions.

Reference is now made to FIG. 1 which illustrates a cross-sectional diagram of a plurality of transistors utilizing a backside contact made to the transistor source-drain regions. Each transistor 10 includes a gate region 12, a source region 14 and a drain region 16. The transistors 10 may be of different conductivity type, with the left transistor 10$n$ comprising an n-channel MOSFET (nFET) and the right transistor 10$p$ comprising a p-channel MOSFET (pFET) for a CMOS circuit implementation. A gate contact 18 extends from above the transistor to make electrical contact to the gate region 12. A source-drain contact 20 extends from below the transistor to make electrical contact to the source region 14 and/or drain region 16 (using, for example, a silicide region 22). The transistors 10 are formed on and in a substrate 24. In the illustrated embodiment of FIG. 1, the substrate 24 comprises a silicon on insulator (SOI) substrate including a semiconductor layer 24a, an insulator layer 24b and a semiconductor layer 24c which are stacked on top of each other in a manner well known to those skilled in the art. The top semiconductor layer 24c may, for example, be of the fully depleted type. The gate contact 18 extends through insulating materials 26 and 28 to reach the gate region 12. These insulating materials form the pre-metal dielectric region as known to those skilled in the art. The top surface of the insulating materials, along with the top surface of the gate contact 18, is planarized to provide a co-planar surface 30 configured to support further back end of line (BEOL) fabrication (such as the addition of metallization layers and pads) known to those skilled in the art.

Figure 2A:
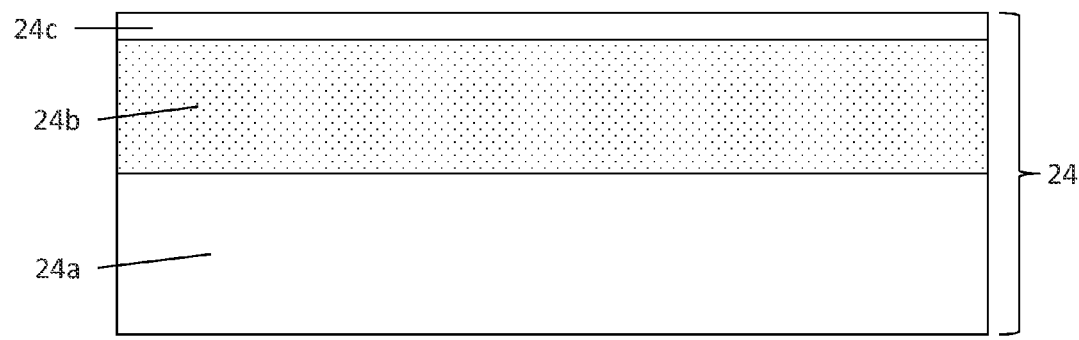
FIGS. 2A-2Q illustrate process steps for forming the integrated circuit shown in FIG. 1.
Figure 2B:
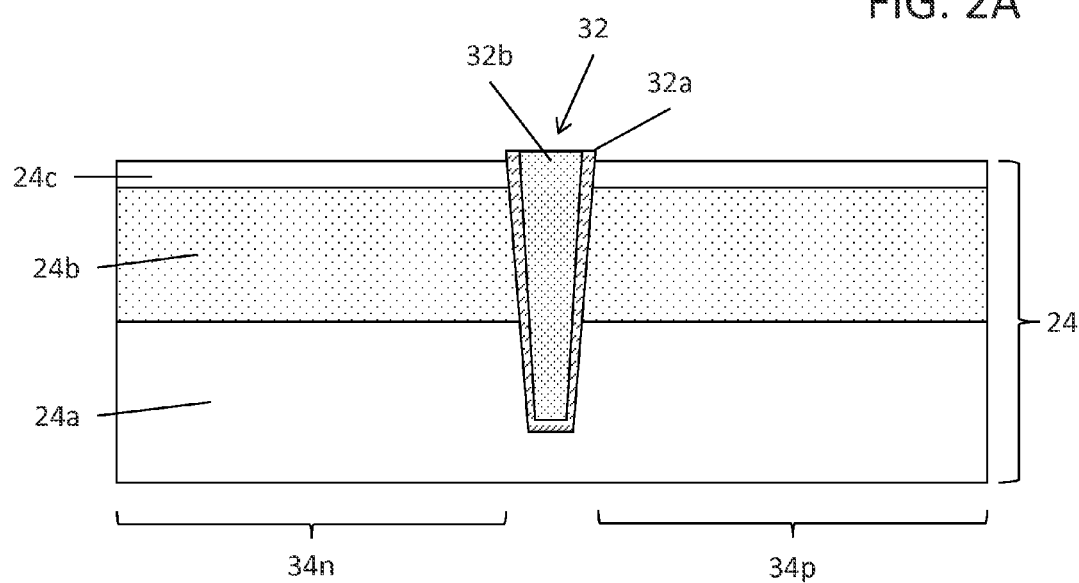
Figure 2C:
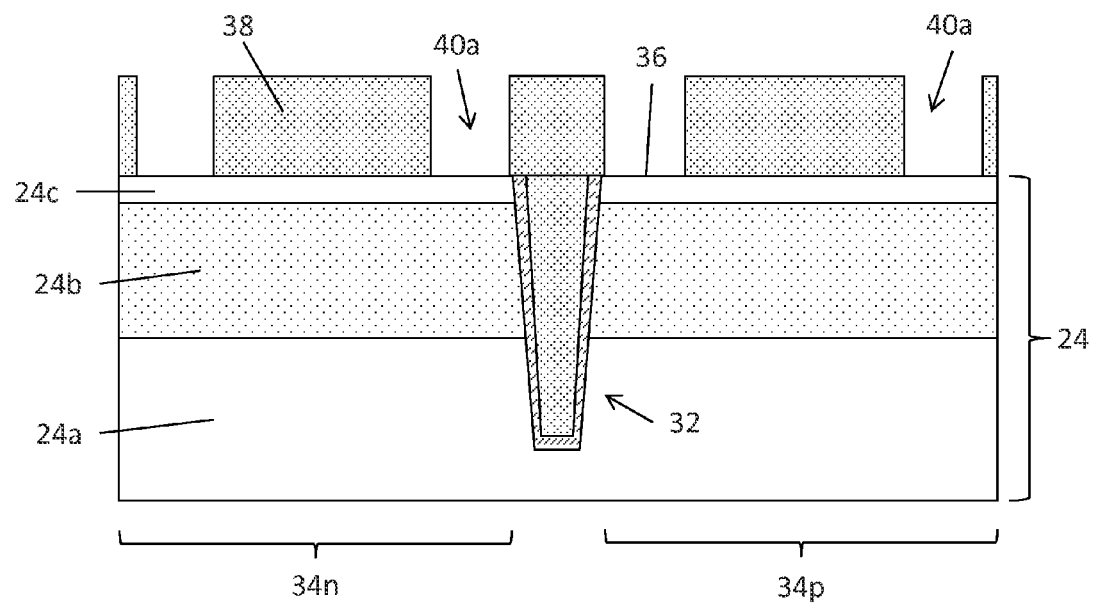
Figure 2D:
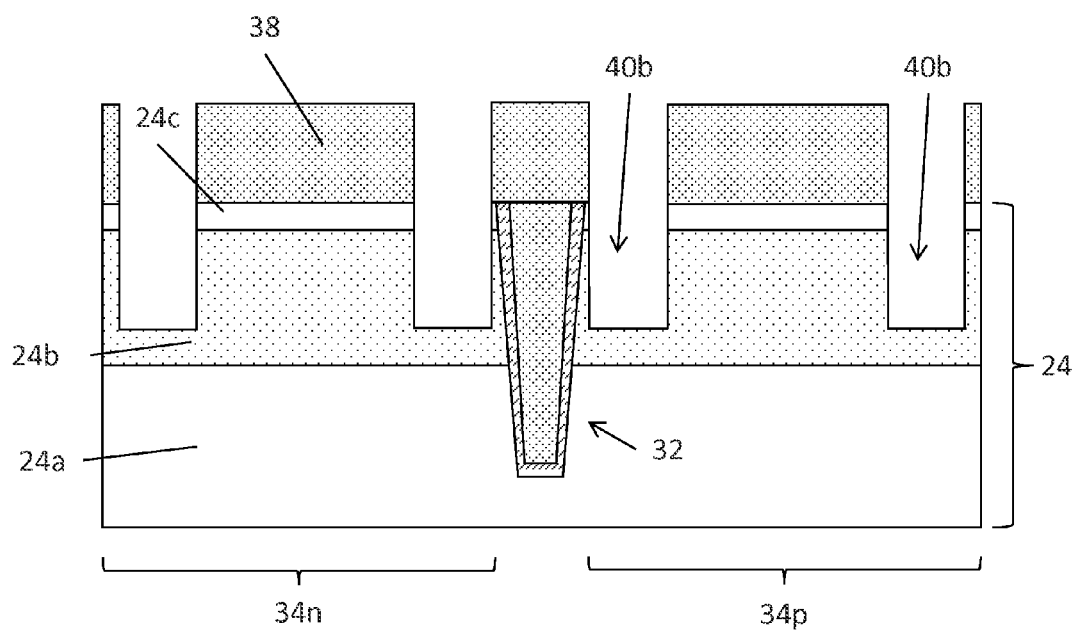
Figure 2E:
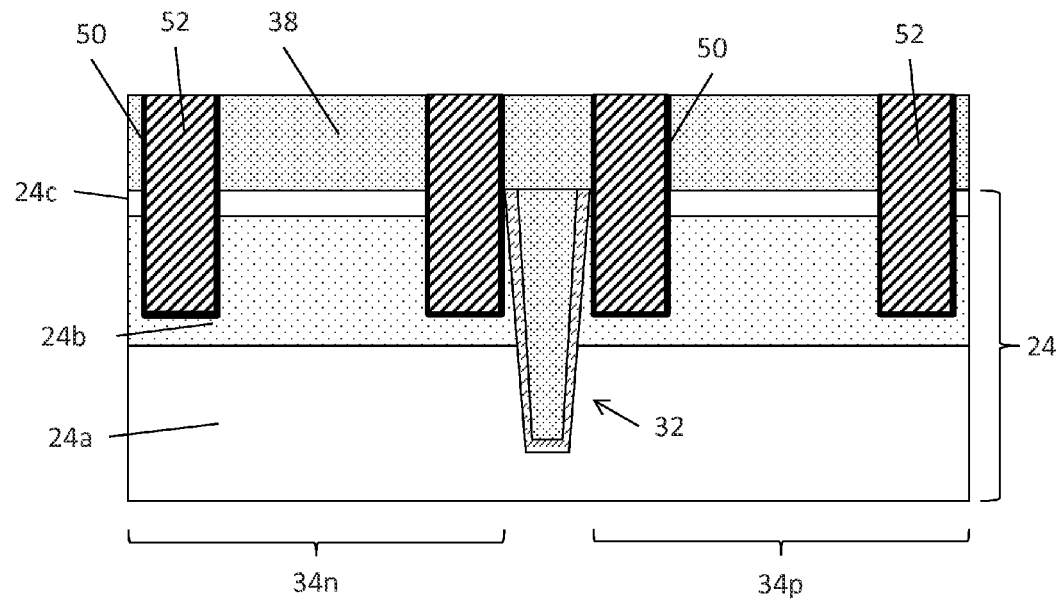
Figure 2F:
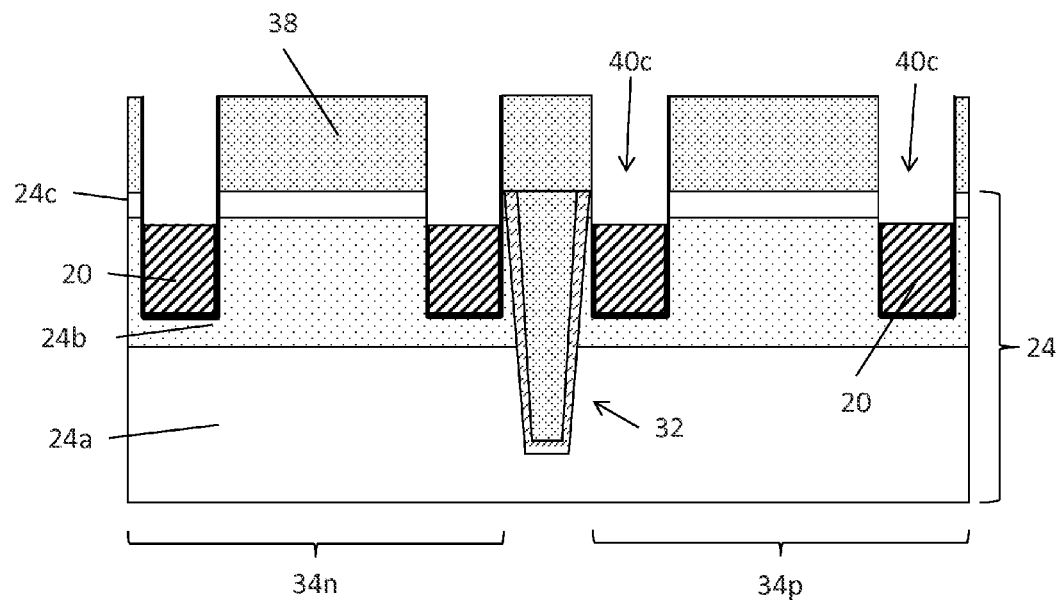
Figure 2G:
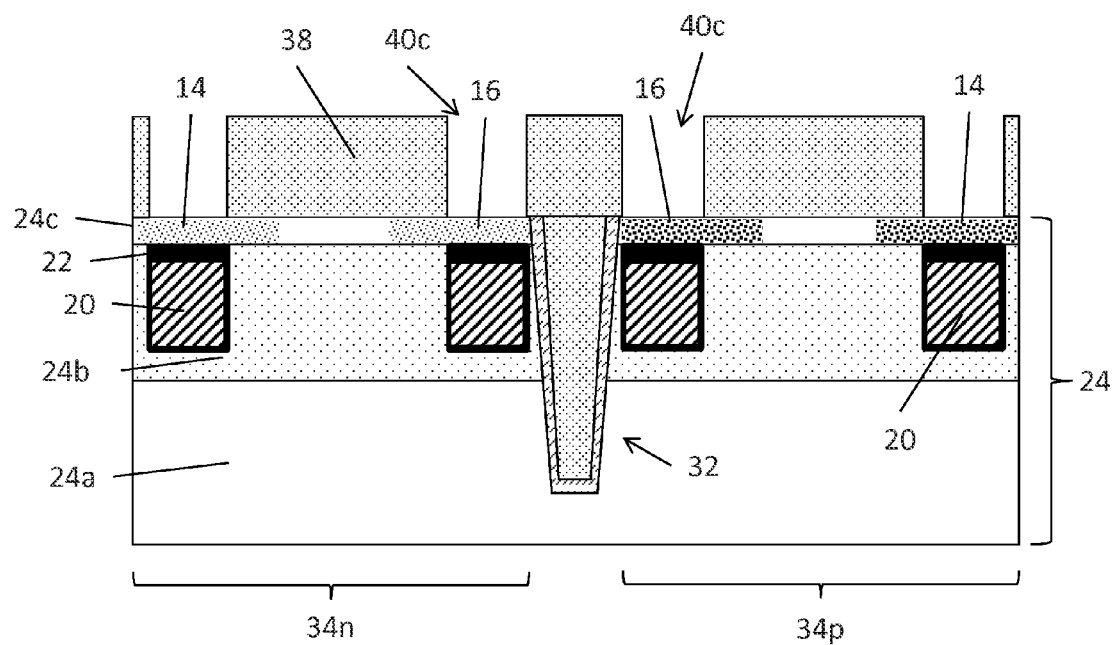
Figure 2H:
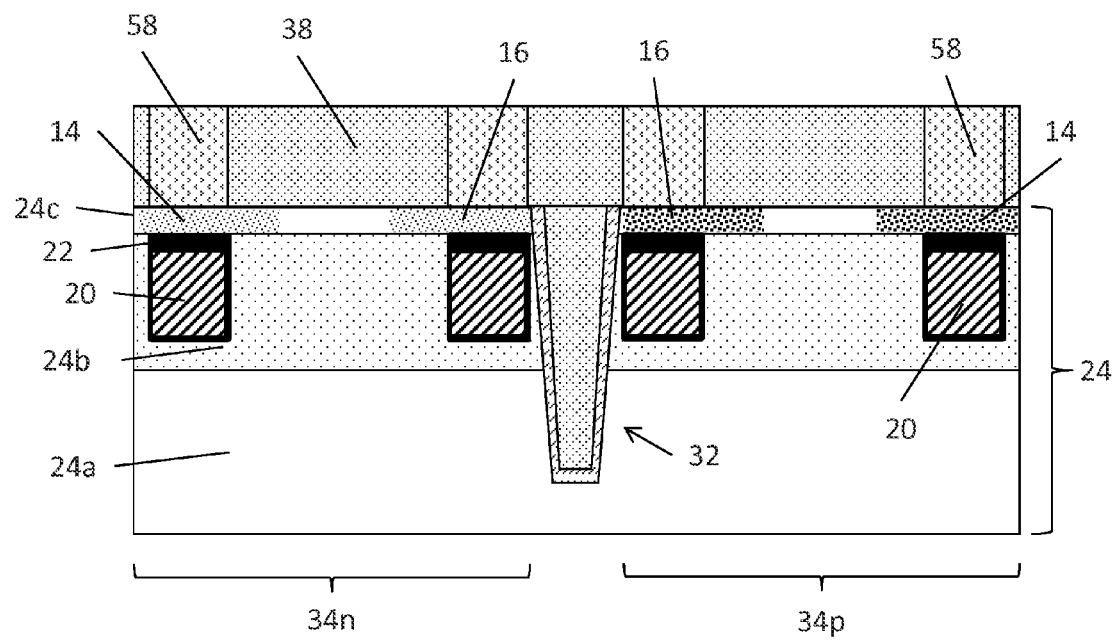
Figure 2I:
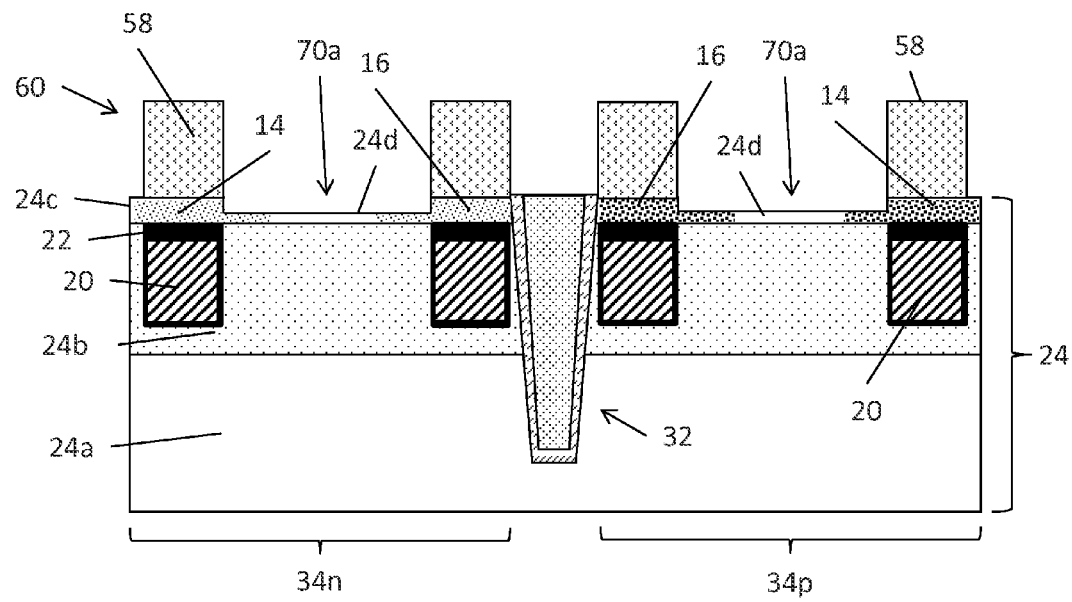
Figure 2J:
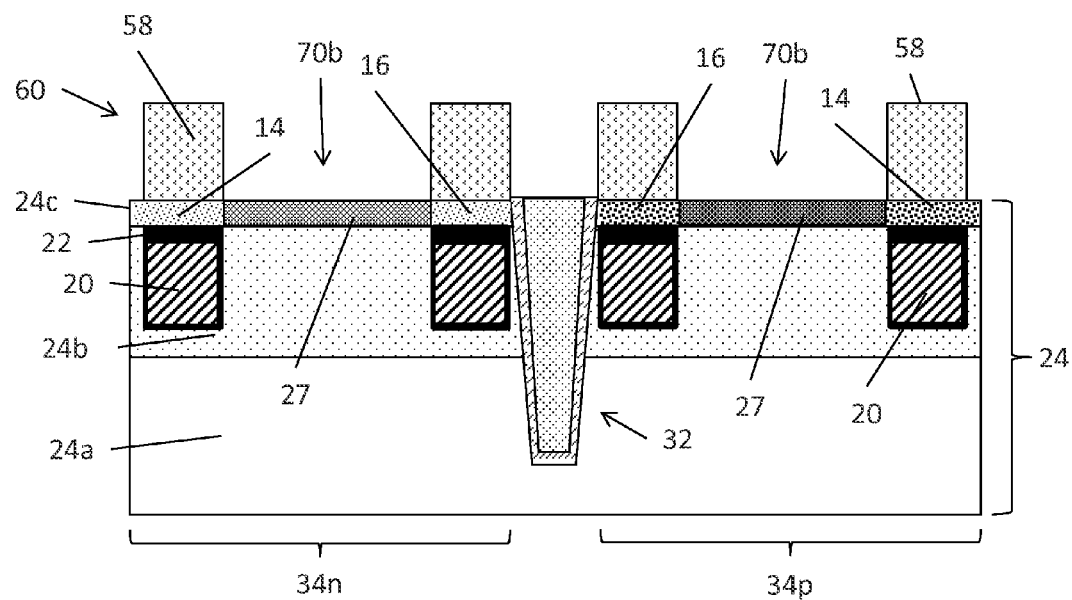
Figure 2K:
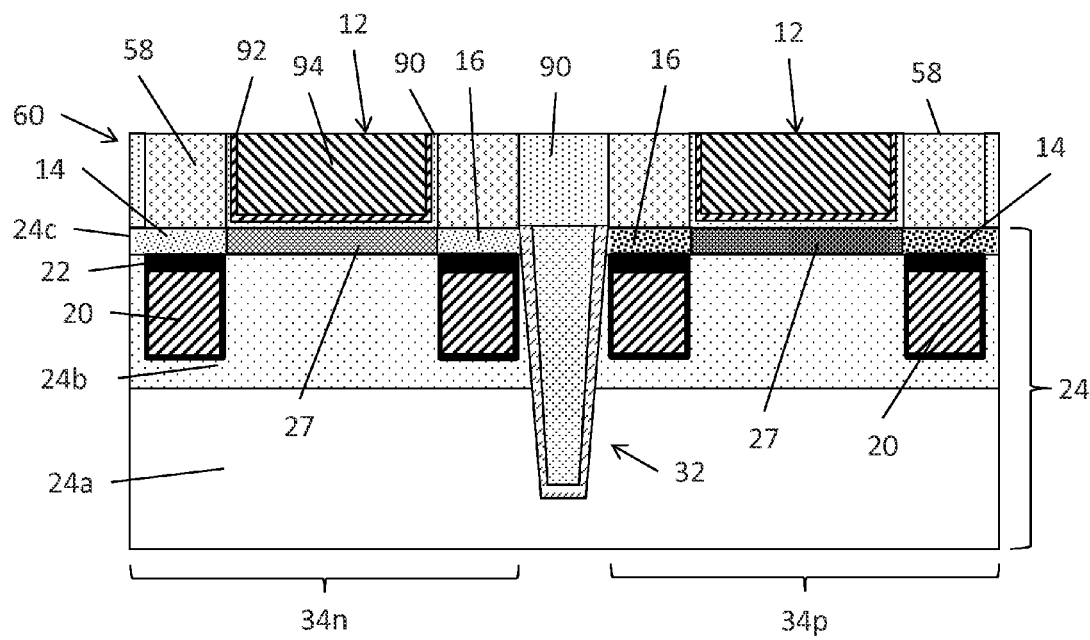
Figure 2L:
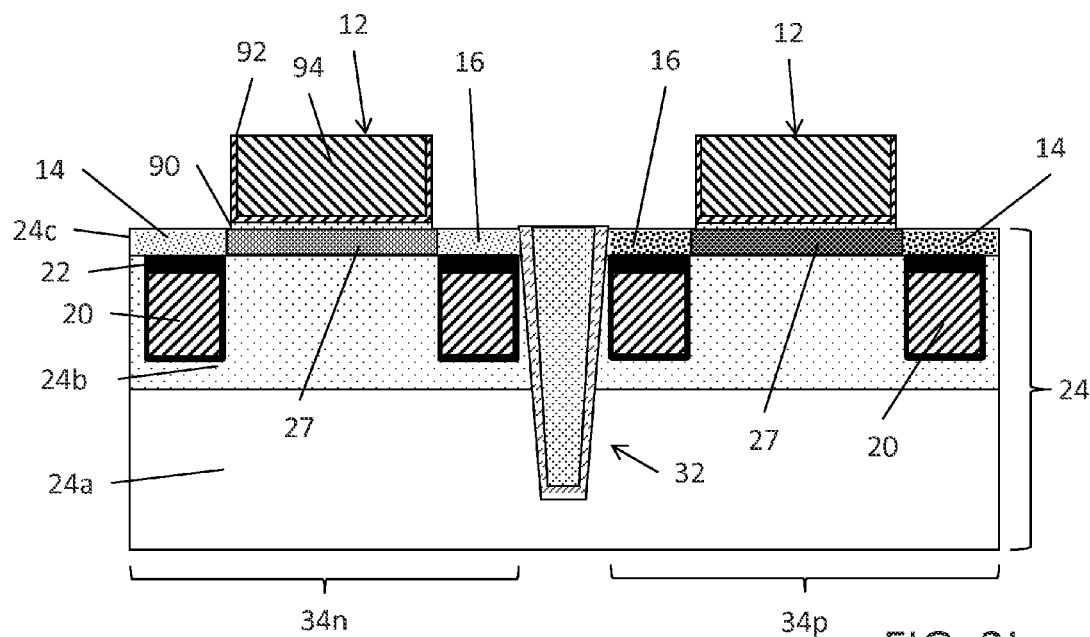
Figure 2M:
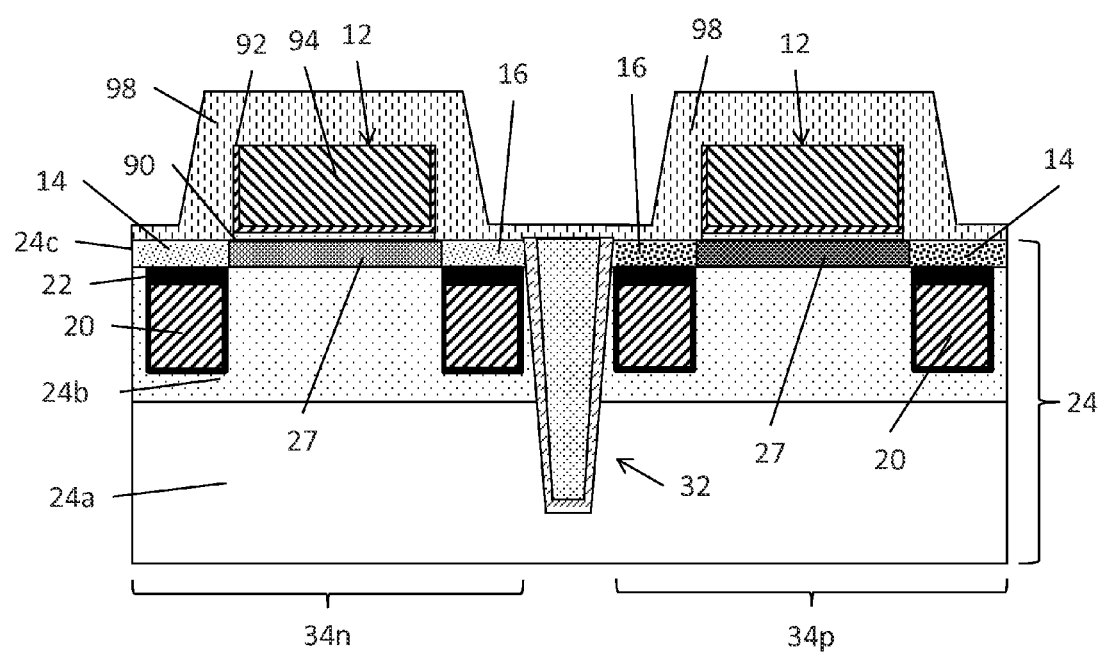
Figure 2N:
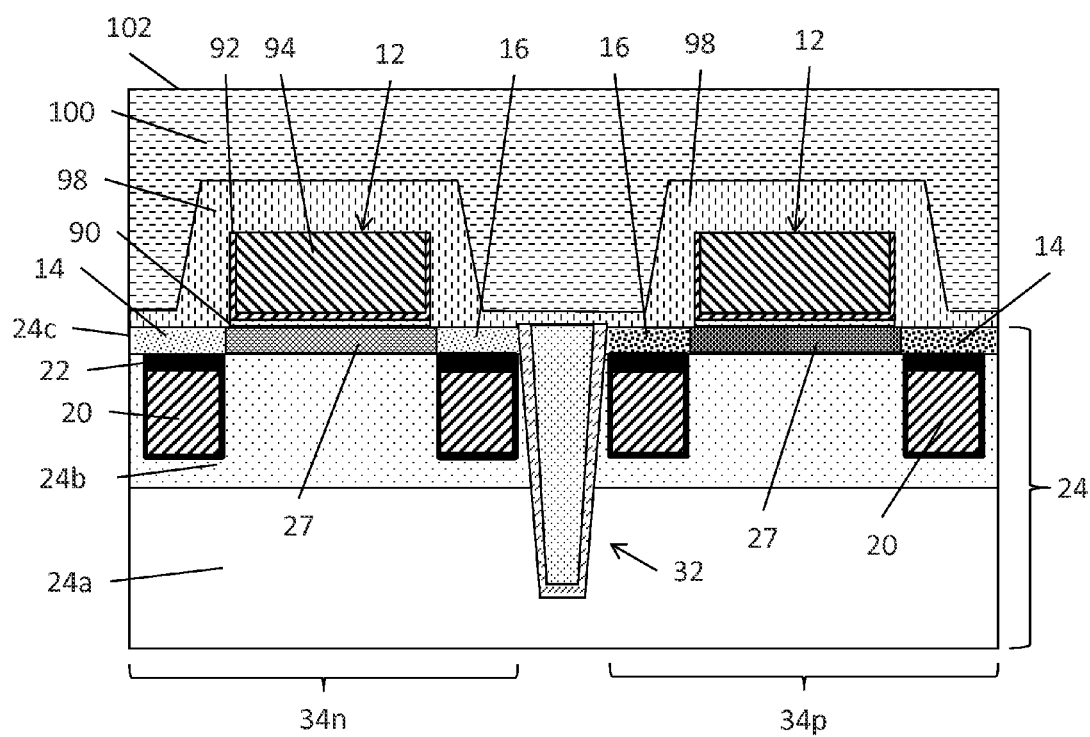
Figure 2O:
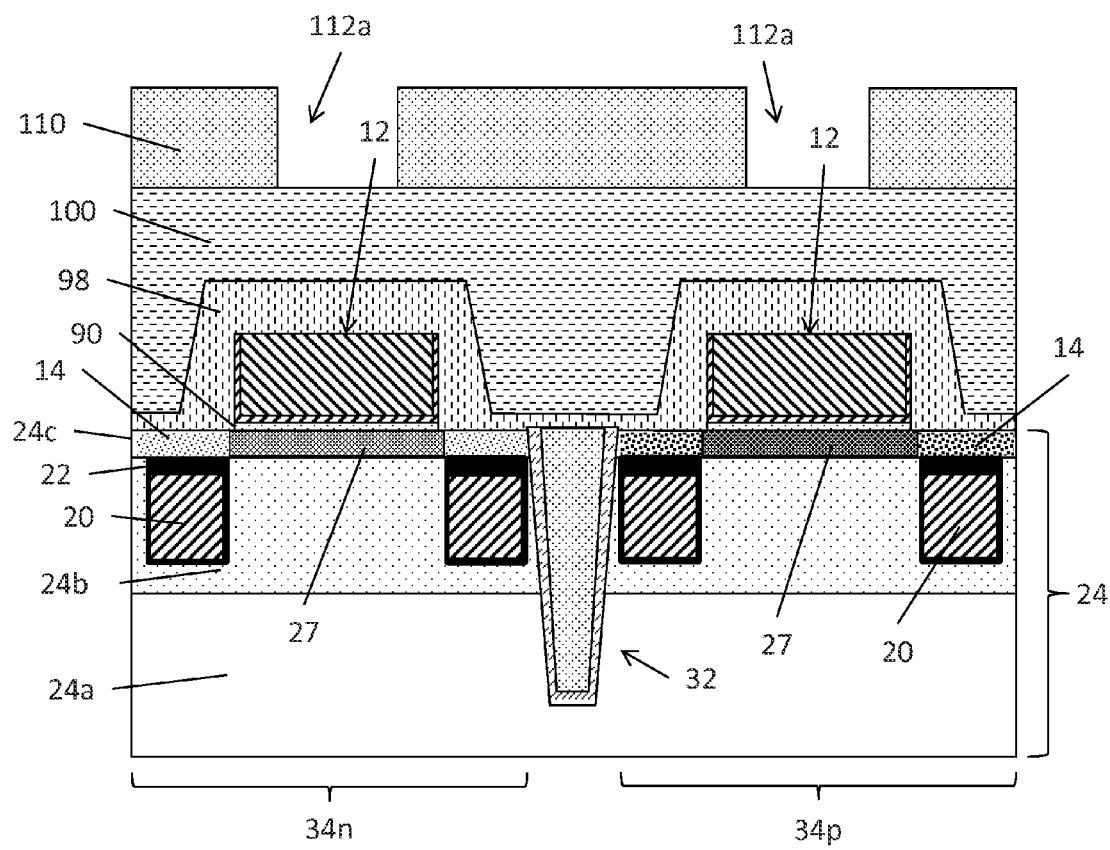
Figure 2P:
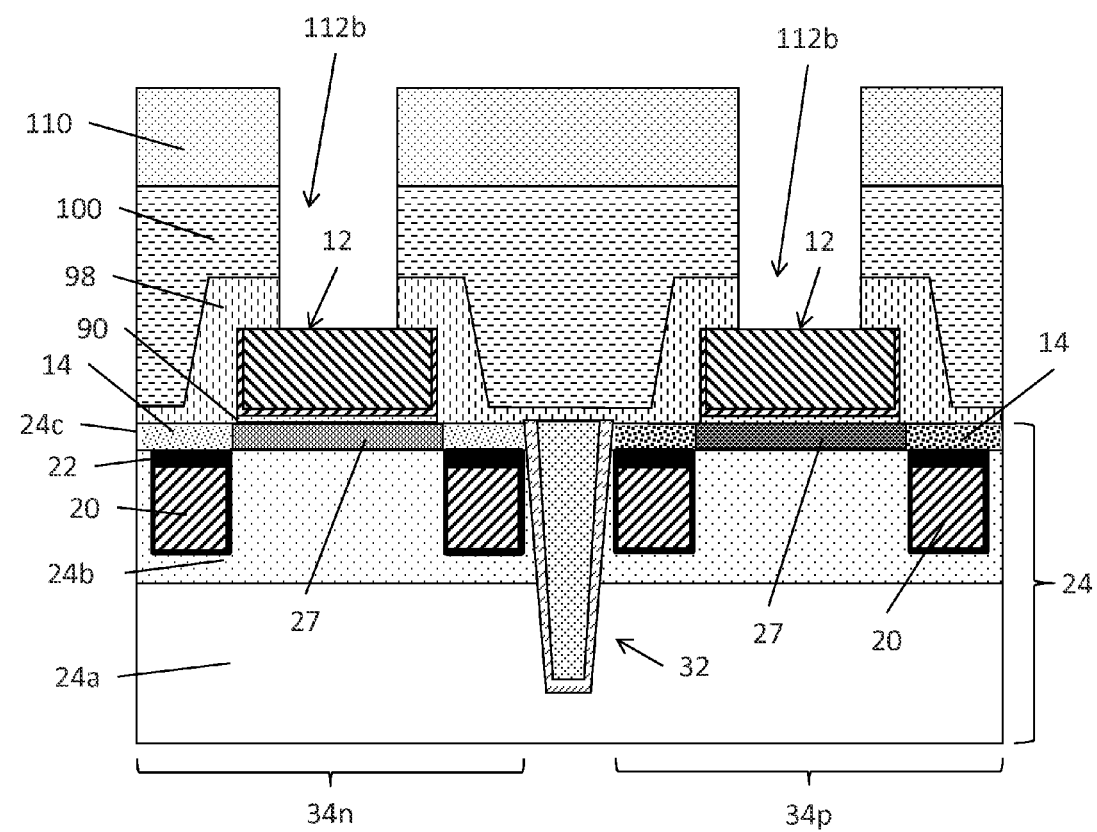
Figure 2Q:
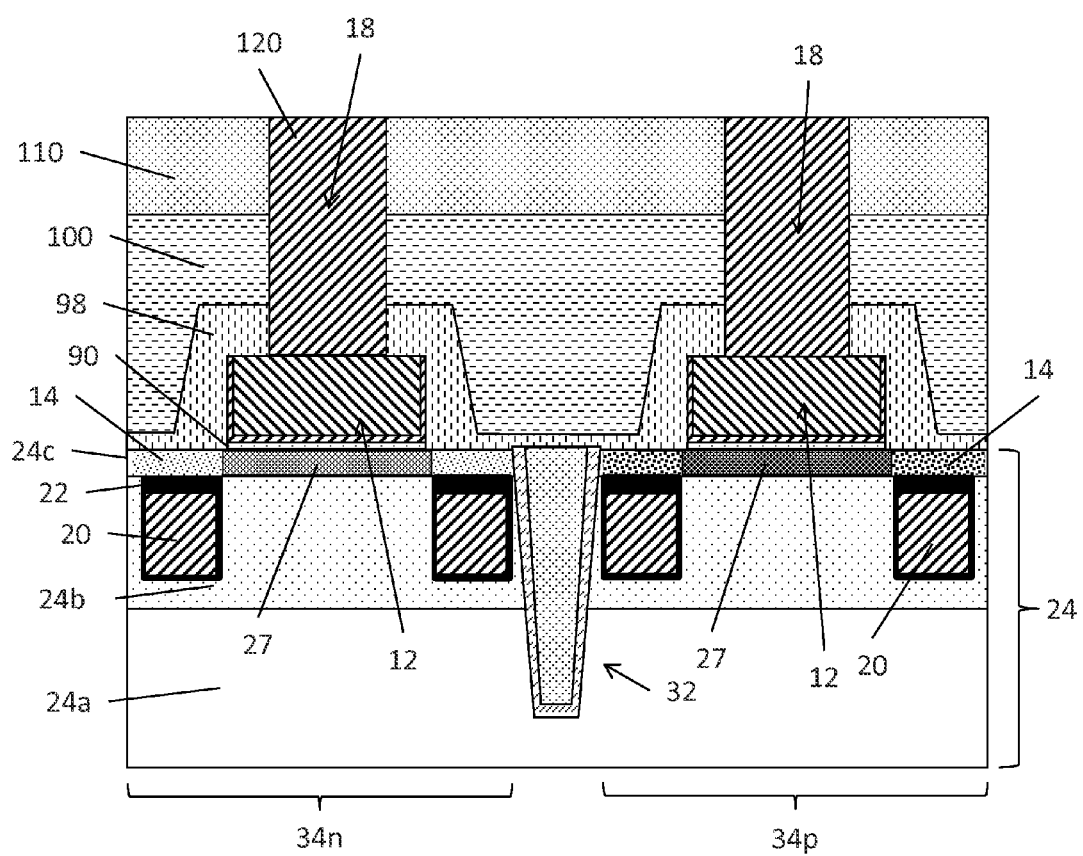

Reference is now made to FIGS. 2A-2Q which illustrate process steps for forming the integrated circuit shown in FIG. 1.

FIG. 2A shows a silicon on insulator (SOI) substrate 24 wafer of a conventional type. For example, the wafer may comprise a standard thick SOI substrate as known in the art. The substrate 24 could alternatively comprise a silicon on insulator (SOI) substrate of the extremely thin silicon on insulator (ETSOI) type. The substrate wafer 24 comprises a top semiconductor layer 24c over an insulating (for example, made of silicon dioxide) layer (BOX) 24b over a bottom semiconductor substrate layer 24a. The top semiconductor layer 24c and bottom semiconductor substrate layer 24a may be doped as appropriate for the integrated circuit application. The thickness of the top and bottom semiconductor layers 24c and 24a may be tuned (for example, through the use of a thinning or epitaxy operation) as needed for the integrated circuit application. The top semiconductor layer 24c may, in a preferred embodiment, have a fully depleted (FD) configuration (although a partially depleted layer is also a possibility for some applications).

Using fabrication techniques well known to those skilled in the art, shallow trench isolation (STI) structures 32 are formed in the substrate 24 so as to divide the substrate 24 wafer into a plurality of active regions 34 (for example, an active region 34n for fabrication of circuits of a first conductivity type and an active region 34p for fabrication of circuits of a second conductivity type. The result of the STI structure fabrication is shown in FIG. 2B. The STI structure 32 is formed in a trench that has been etched into the substrate 24 (for example, extending completely through the top semiconductor layer 24c and insulating layer 24b and further extending at least partially through the bottom semiconductor substrate layer 24a. The trench is then lined with a liner 32a and filled by an insulating fill material 32b. The liner 32a may be made of SiN and the insulating fill material 32b may comprise $SiO_2$.

A patterned mask 38 is then formed on a top surface 36 of the wafer. The mask 38 includes a number of openings 40a which correspond to the locations where source-drain contacts 20 (see, FIG. 1) are to be formed. The material used for the patterned mask 38 may, for example, comprise a thermal $SiO_2$ material that is patterned using a lithographic etch technique in a manner well known to those skilled in the art. The result is shown in FIG. 2C.

A highly direction etch as known in the art is then used with the mask 38 to etch openings 40b which extend completely through the semiconductor layer 24c and into (but not completely through) the insulator layer 24b of the substrate 24. The result of the etch process is shown in FIG. 2D.

The openings 40b are then lined with a metal liner 50 and filled with a metal material 52. The liner 50 may comprise TiN or TiC and the metal conductor material 52 may comprise W. The line and fill operations may be performed using a chemical vapor deposition (CVD) process, as known in the art. The result of this deposition may produce metal material from the liner and fill material covering the mask 38. A chemical-mechanical polishing (CMP) operation is performed to remove the metal materials down to the level of the mask 38. The result of the fill and polish process is shown in FIG. 2E.

An etch which is selective to remove the metal material, such as a plasma etch using $BCl_3$ chemistry, as known in the art, is then performed to recess the deposited liner 50 and metal material 52 within the openings 40b to produce the source-drain contacts 20. The recess process removes the metal material down to a level at or below the interface between the insulator layer 24b and the semiconductor layer 24c. The result of the etch process, which leaves openings 40c, is shown in FIG. 2F.

A process for epitaxial growth from the top semiconductor layer 24c is then performed in each of the openings 40c. Any suitable epitaxial growth process known in the art, such as well-known cyclic epitaxy, may be used. In the active region 34n, the epitaxial growth comprises SiCP epitaxy configured to grow semiconductor material to form source regions 14 and drain regions 16. It will be noted that the Phosphorous (P) dopant provided during the epitaxial growth in active region 34n may laterally diffuse into the top semiconductor layer 24c underneath the mask 38. In the active region 34p, the epitaxial growth comprises SiGeB epitaxy configured to grow semiconductor material to form source regions 14 and drain regions 16. It will be noted that the Boron (B) dopant provided during the epitaxial growth in active region 34p may laterally diffuse into the top semiconductor layer 24c underneath the mask 38. The metal material 52 of the source-drain contacts 20 may also react with the epitaxial growth to form a silicide region 22 at the top of each source-drain contact 20. The result is shown in FIG. 2G. It will be understood that the junction between the source-drain contacts 20 and the source regions 14 and drain regions 16 may comprise an MIS-type contact as known in the art (where the insulator material, not explicitly shown, may comprise $TiO_2$). In a preferred embodiment, the source regions 14 and drain regions 16 formed by epitaxial growth will have a thickness substantially equal to the thickness of the top semiconductor layer 24c.

The openings 40c are then filled with an insulating material 58. The material 58 may, for example, comprise SiN. The material 58 may be conformally deposited, for example using a HDP CVD process, in a manner well known in the art. In such a case, the material may cover the mask 38. A chemical-mechanical polishing (CMP) operation is performed to remove the material 58 down to the level of the mask 38. The result of the deposit of the fill and polish process is shown in FIG. 2H.

A selective etch, for example, RIE, is then performed to remove the mask 38, with the material 58 that remains after completing the etch defining another mask 60. The etch to remove the mask 38 will also remove some, and perhaps substantially all, of the top semiconductor layer 24c which was located under the mask 38 so as to form openings 70a which correspond to the locations where the gate regions 12 (see, FIG. 1) are to be formed. A portion 24d of the top semiconductor layer 24c remains in each opening 70a as a seed for subsequent epitaxial growth (to be described below). The result of the etch process is shown in FIG. 2I.

An epitaxial growth process from the remaining portion 24d is then performed in each of the openings 70a. In the active region 34n, the epitaxial growth comprises Si epitaxy to form the channel region 27 for the nMOS transistor 10n. In the active region 34p, the epitaxial growth comprises SiGe epitaxy to form the channel region 27 for the pMOS transistor 10p. The result is shown in FIG. 2J with openings 70b remaining after completion of the expitaxial growth process. It will be understood that the epitaxial growth to form the channel regions 27 is not performed simultaneously in the openings 70a of different types of active regions, and thus separate masking of the openings 70a based on type of active region, not explicitly shown but understood by those skilled in the art, is needed. In a preferred implementation, the channel regions 27 are not doped, and thus comprise fully-depleted structures. In an alternative embodiment, the channel regions 27 may be doped, concurrent with their epitaxial growth, in a manner known in the art. The epitaxial growth forming the channel regions 27 preferably produces a channel thickness substantially equal to the thickness of the top semiconductor layer 24c (although it will be understood that a thinner channel thickness could alternatively be formed).

Next, a liner 90 of insulating material is conformally deposited within each opening 70b using an ALD process. The insulating material for the liner 90 is preferably a high-k dielectric material selected to function as the gate dielectric for the transistors. A liner 92 of work function metal is then conformally deposited within each opening 70b using an ALD process (it being understood that the work function metal may be provided in association with the formation of one or the other of the transistors 10 only, if desired). Lastly, the remaining vacant portion of each opening 70b is filled with a metal conductor 94 using a CVD or plating process. The deposited materials 90, 92 and 94 may cover the mask 60. A chemical-mechanical polishing (CMP) operation is performed to remove the materials down to the level of the mask 60. The result of the deposit, fill and polish process is shown in FIG. 2K. The metal materials 92 and 94 provide the conductive materials for the gate region 12 of each transistor.

A selective etch, for example, RIE, is then performed to remove the mask 60 and the portion of the insulating material (deposited for the gate dielectric liner 90) which is not located underneath the conductive materials for the gate region 12 (i.e., the sidewall portions). The result is shown in FIG. 2L. The removal of the sidewall portions of the dielectric liner 90 is preferred as this reduces the capacitance between the gate and the source-drain regions.

An encapsulating layer 98 is then grown using a CVD process to cover the wafer. The layer 98 may, for example, be formed of a silicon nitride material or a low-k dielectric material such as SiOCN or SiBCN. The result is shown in FIG. 2M.

A dielectric material 102, such as an oxide material, is then conformally deposited over the encapsulating layer 98 using a CVD process, as known in the art. The dielectric material 102 forms part of the pre-metal dielectric of the integrated circuit. Because of the shape of the encapsulating layer 98 and the conformal deposit of the dielectric material 102, the top surface of the deposit will not likely be planar. A chemical-mechanical polishing (CMP) operation is thus performed on the dielectric material 102 to provide for a planar top surface 104 of the pre-metal dielectric region. The result is shown in FIG. 2N.

A patterned mask 110 is then formed on the top surface 104 of the wafer, the mask 110 including a number of openings 112a which correspond to the locations where the gate contacts 18 (see, FIG. 1) are to be formed. The material used for the patterned mask 110 may, for example, comprise thermal $SiO_2$ material patterned using a lithographic etch in a manner well known to those skilled in the art. The result is shown in FIG. 2O.

A highly direction etch as known in the art is then used with the mask 110 to etch openings 112b which extend completely through the dielectric material 102 and encapsulating layer 98 to reach a top surface of the conductive material 94 for the gate region 12. The result of the etch process is shown in FIG. 2P.

The openings 112b are then lined with a metal liner (not explicitly shown) and filled with a metal material 120. The liner may comprise TiN or TiC and the metal conductor material 120 may comprise W. The line and fill operations may be performed using a chemical vapor deposition (CVD), as known in the art, to produce a result as shown in FIG. 2Q. The result of this deposition may produce metal material covering the mask 110. Various processing operations to reduce the liner and metal material 120 within the openings 112b, as well as to remove the mask 110, such as, for example, etches and chemical-mechanical polishing (CMP) operations, are then performed to remove the metal down to the level of the pre-metal dielectric material 100. The result of the remove process is shown in FIG. 1 to provide the gate contact 18.

Although a single damascene process is illustrated by FIGS. 2O and 2P, it will be understood that a dual damascene process, as well known in the art, could alternatively be used to form not only an opening in the pre-metal dielectric region for placement of the gate contacts 18, but also an adjoining opening in the pre-metal dielectric region for placement of an interconnecting metal line, if desired. As an example, such an interconnecting metal line could directly electrically connect the gate regions of the nMOS transistor 10n and the pMOS transistor 10p (for example, to form a CMOS inverter circuit). Alternatively, such an interconnecting metal line could directly electrically connect the gate regions of two nMOS transistors 10n (or two PMOS transistors 10p).

Figure 3:
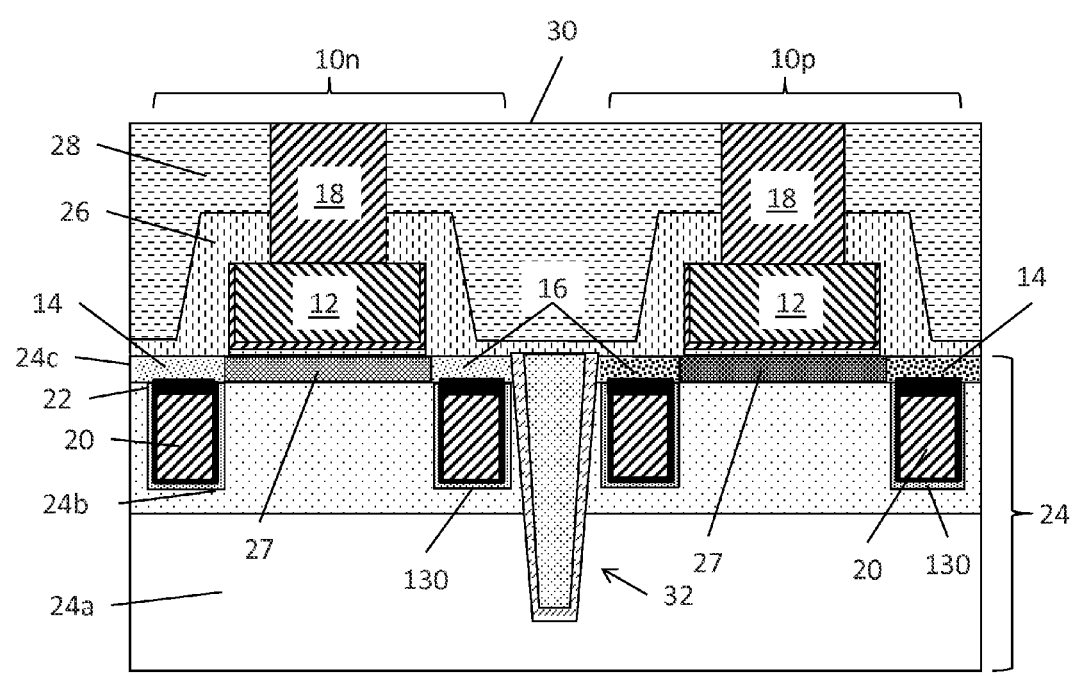
FIG. 3 is a cross-sectional diagram of a plurality of transistors which utilize a backside contact made to the transistor source-drain regions.

Reference is now made to FIG. 3 which illustrates a cross-sectional diagram of a plurality of transistors utilizing a backside contact made to the transistor source-drain regions. Like reference numbers refer to like or similar parts as shown in FIG. 1 and will not be further described. The transistors of FIG. 3 differ from the transistors of FIG. 1 in that each source-drain contact 20 is surrounded by a dielectric layer 130. The dielectric layer 30 may comprise, for example, a high-k dielectric material. The layer 130 assists in preventing device leakage. In a particular use of the transistors, the layer 130 may form the capacitor dielectric for a dynamic random access memory (DRAM) element (with the source contact providing one plate of the capacitor).

Figure 4A:
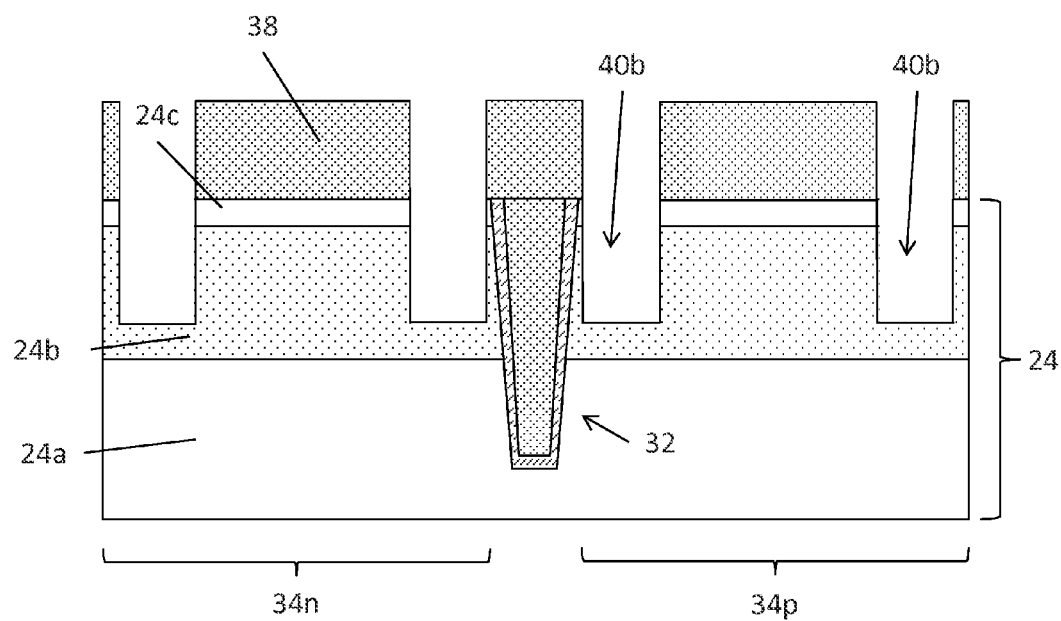
FIGS. 4A-4B illustrate alternative process steps for forming the integrated circuit shown in FIG. 3.
Figure 4B:
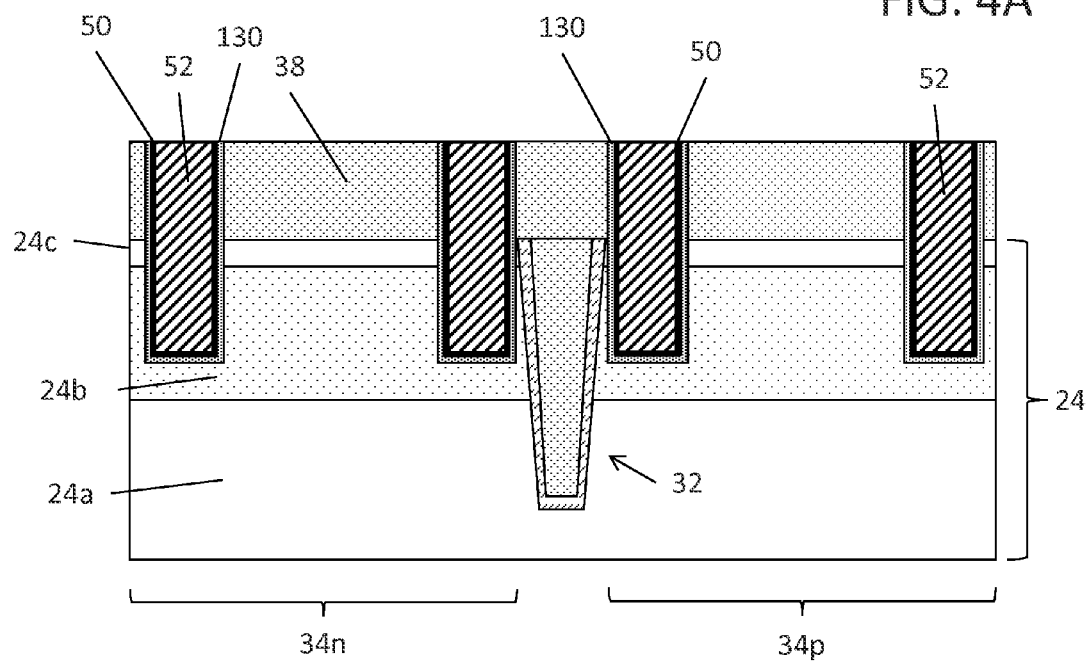

FIGS. 4A-4B illustrate process steps for forming the integrated circuit shown in FIG. 3.

FIG. 4A illustrates the fabrication state of the wafer after completion of the processing steps of FIGS. 2A-2D described above (and incorporated by reference).

The openings 40b are then lined with an insulating liner 130, followed by a metal liner 50 and then filled with a metal material 52. The insulating liner 130 may comprise a high-k dielectric material such as $HfO_2$ deposited using a PVD process. The liner 50 may comprise TiN or TiC and the metal conductor material 52 may comprise W. The line and fill operations may be performed using a chemical vapor deposition (CVD) process, as known in the art. The result of this deposition may produce material from the liners and fill material covering the mask 38. A chemical-mechanical polishing (CMP) operation is performed to remove the materials down to the level of the mask 38. The result of the fill and polish process is shown in FIG. 4B.

At this point, the fabrication process continues with FIGS. 2F to 2Q so as to produce the integrated circuit shown in FIG. 3. The fabrication process steps of FIGS. 2F-2Q are incorporated by reference to follow the fabrication process steps of FIGS. 4A-4B.

Figure 5:
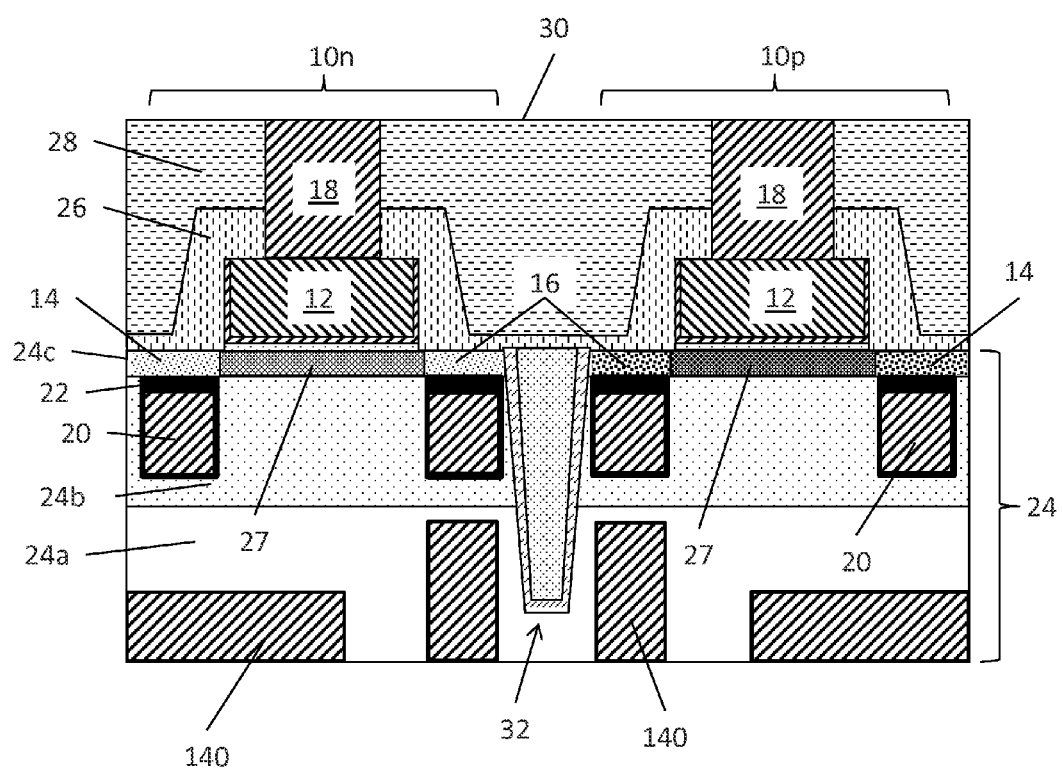
FIG. 5 is a cross-sectional diagram of a plurality of transistors which utilize a backside contact made to the transistor source-drain regions.

Reference is now made to FIG. 5 which illustrates a cross-sectional diagram of a plurality of transistors which utilize a backside contact made to the transistor source-drain regions. This cross-section differs from FIGS. 1 and 3 in that the semiconductor layer 24a has been processed, using well known back-side processing techniques such as etch and fill, to form a plurality of conductive structures 140 extending in from the back side surface. The conductive structures 140 may comprise structures for thermal dissipation of heat. The conductive structures 140 may alternatively comprise structures for electrical interconnection (such as lines and/or vias, including the use of through silicon via (TSV) structures as known in the art). Although not specifically illustrated, the conductive structures 140 may comprise a liner made of an insulating material so as to insulate the conductive structure from the semiconductor layer 24a.

A number of advantages accrue from the transistor fabrication process described above. First, producing backside source and drain contacts (reference 20) permits an increase in the density of the transistor device layout. In this regard, the transistor pitch can be reduced because space need not be reserved in the layout to permit the dropping of source and drain contacts from above the transistor as is common in prior art implementations. Second, the backside source and drain contacts exhibit a shorter local length, and thus have a reduced resistance. This beneficially reduces the RC time constant of the transistor resulting in improved device speed. Third, as shown in FIG. 2L, the portion of the high-k dielectric material on the sides of the conductive gate region 12 is advantageously removed. The transistors will accordingly have reduced capacitance between the gate region and the source/drain regions. This beneficially reduces the RC time constant of the transistor resulting in improved device speed. Fourth, the process use of the second mask (reference 60) advantageously permits fabrication in accordance with a gate-last formation which is simpler and less expensive, and furthermore permits for a self-aligned formation of the gate region. Fifth, as shown in FIGS. 3 and 4B, a layer of high-k dielectric material can be formed under and around the source and drain contacts 20, with that layer functioning as a capacitor dielectric material for the memory capacitor of a DRAM cell.

Figure 6A:
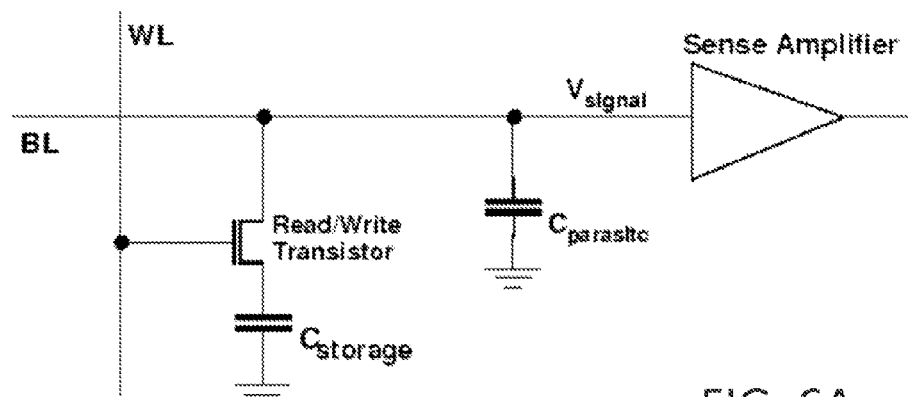
FIG. 6A is a schematic diagram of a DRAM circuit.

Reference is now made to FIG. 6A which shows a schematic diagram of a DRAM circuit. The DRAM circuit includes a word line (WL) and a bit line (BL). At the intersection of the word line and bit line, a DRAM cell is formed. The cell comprises a read/write transistor and a storage capacitor ($C_{storage}$). The read/write transistor is formed by an n-channel MOSFET device having a gate terminal coupled to the word line and a drain terminal coupled to the bit line. The source terminal of the read/write transistor is coupled to a first plate of the storage capacitor. The second plate of the storage capacitor is coupled to a reference supply voltage node (for example, ground). The bit line is further coupled to a sense amplifier operable to sense a bit line voltage ($V_{signal}$). The bit line has an associated parasitic capacitance ($C_{parasitic}$).

Figure 6B:
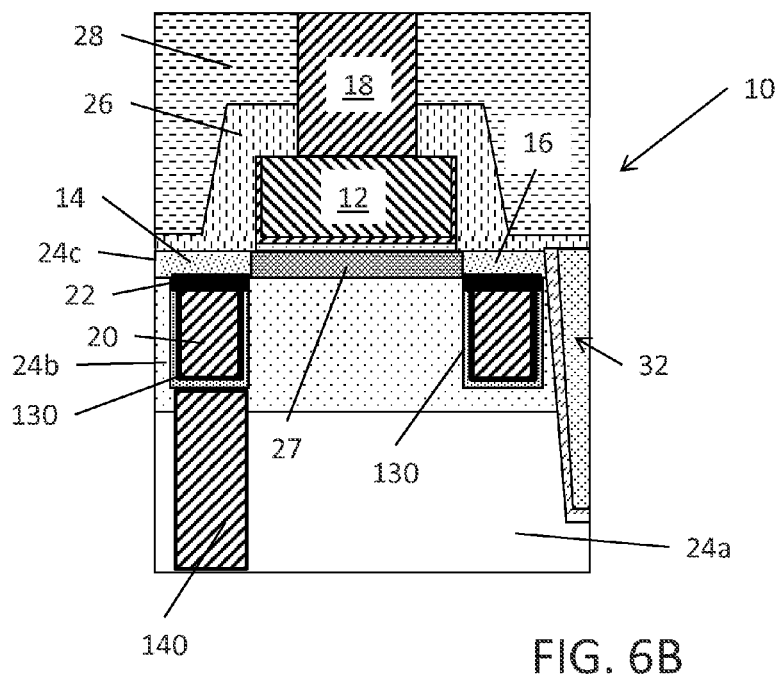
FIGS. 6B and 6C are a cross-sectional diagrams of the read/write transistor for the DRAM circuit of FIG. 6A.

FIG. 6B shows a cross-section of the read-write transistor with integrated storage capacitor. The contact 20 for the source region 14 is surrounded by the insulating liner 130. The liner 130 is formed of a high-k dielectric material. The transistor further includes a conductive structure 140 extending into the substrate 24 from the back side in alignment with the contact 20 for the source region. The conductive structure abuts the liner 130. A metal-insulator-metal (MIM) capacitor is accordingly formed by the contact 20, liner 130 and conductive structure 140. This MIM capacitor forms the storage capacitor ($C_{storage}$) of a DRAM cell and the transistor 10 forms the read/write transistor of the DRAM cell.

Figure 6C:
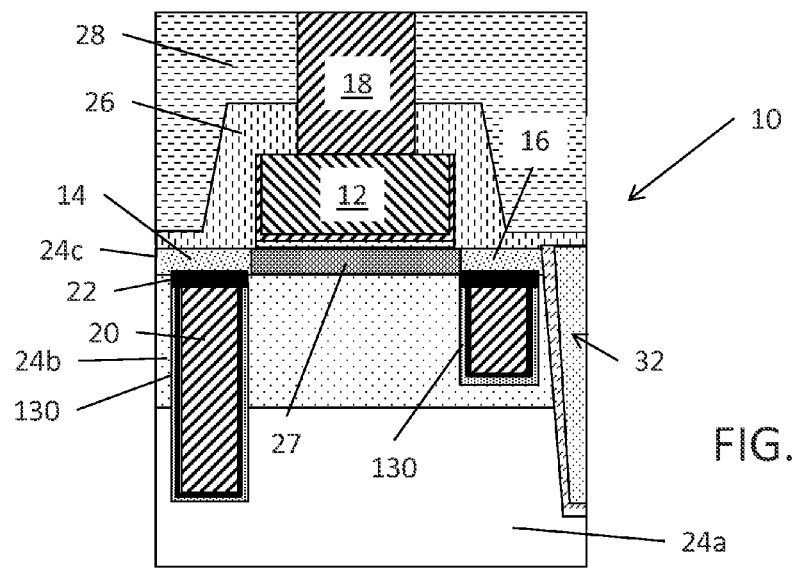

FIG. 6C shows a cross-section of the read-write transistor with integrated storage capacitor. This embodiment differs from FIG. 6B in that the contact 20 for the source region 14 extends through the insulating layer 24b and into the bottom semiconductor substrate layer 24a. The contact 20 for the source region 14 is surrounded by the insulating liner 130. The liner 130 is formed of a high-k dielectric material which abuts the bottom semiconductor substrate layer 24a. A metal-insulator-semiconductor (MIS) capacitor is accordingly formed by the contact 20, liner 130 and bottom semiconductor substrate layer 24a. This MIS capacitor forms the storage capacitor ($C_{storage}$) of a DRAM cell and the transistor 10 forms the read/write transistor of the DRAM cell.

Figure 7:
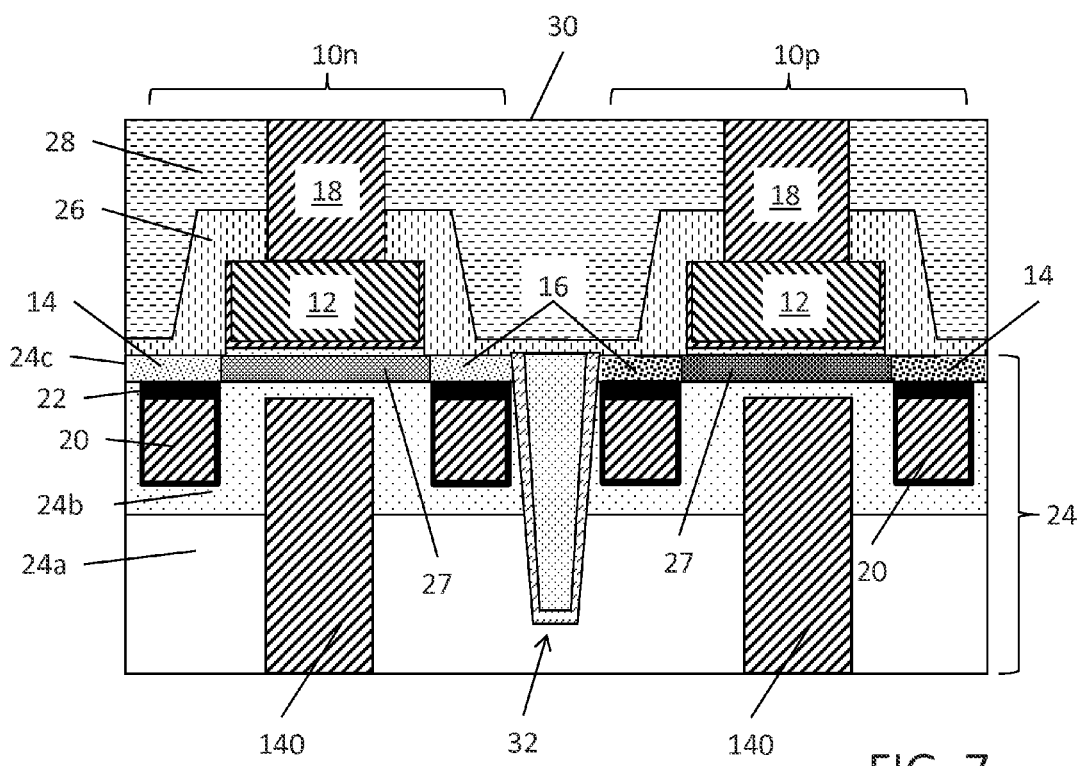
FIG. 7 is a cross-sectional diagram of a plurality of transistors which utilize a backside contact made to the transistor source-drain regions.

Reference is now made to FIG. 7 which illustrates a cross-sectional diagram of a plurality of transistors which utilize a backside contact made to the transistor source-drain regions. This cross-section differs from FIGS. 1, 3 and 5 in that the semiconductor layer 24a has been processed, using well known back-side processing techniques such as etch and fill, to form a plurality of conductive structures 140. The conductive structures 140 are positioned between the contacts 20 and extend through the bottom semiconductor substrate layer 24a and into the insulating layer 24b to a position adjacent the channel regions 27. The conductive structures 140 accordingly form a backside (or second) gate for the transistors 10.

Although the cross-sections show that the STI structure 32 does not extend fully through the bottom semiconductor substrate layer 24a, it will be understood that this is exemplary only and that in some implementations the STI structures will extend fully though and thus isolate the action regions from each other. In such an implementation, the bottom semiconductor substrate layer 24a in each active region may be contacted with a bias voltage or a control signal.

Figure 8A:
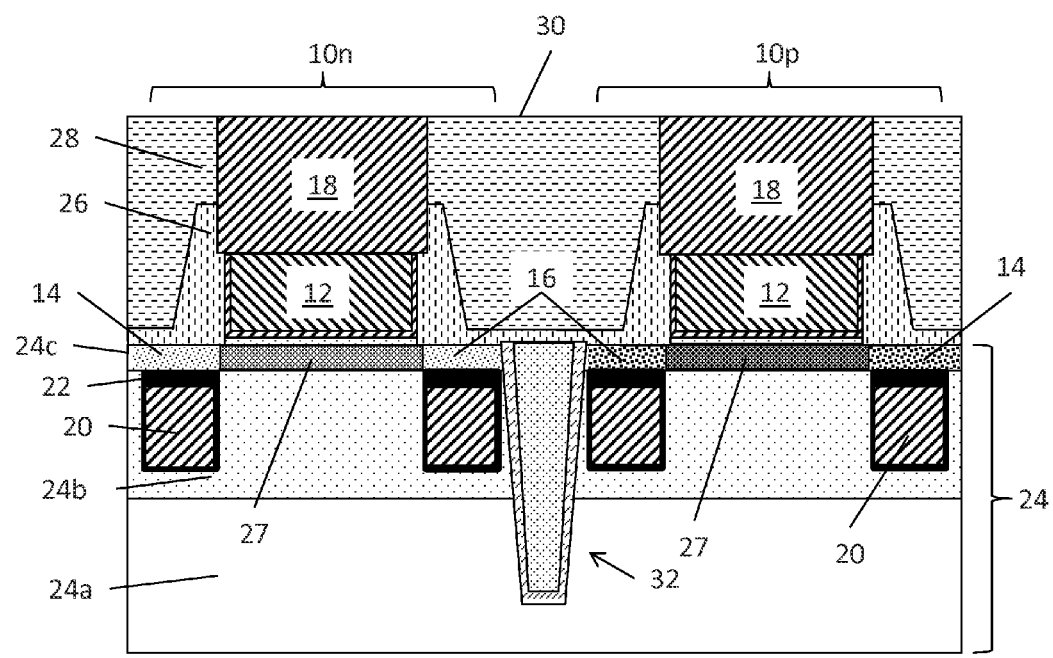
FIGS. 8A and 8B are cross-sectional diagrams of a plurality of transistors which utilize a backside contact made to the transistor source-drain regions.
Figure 8B:
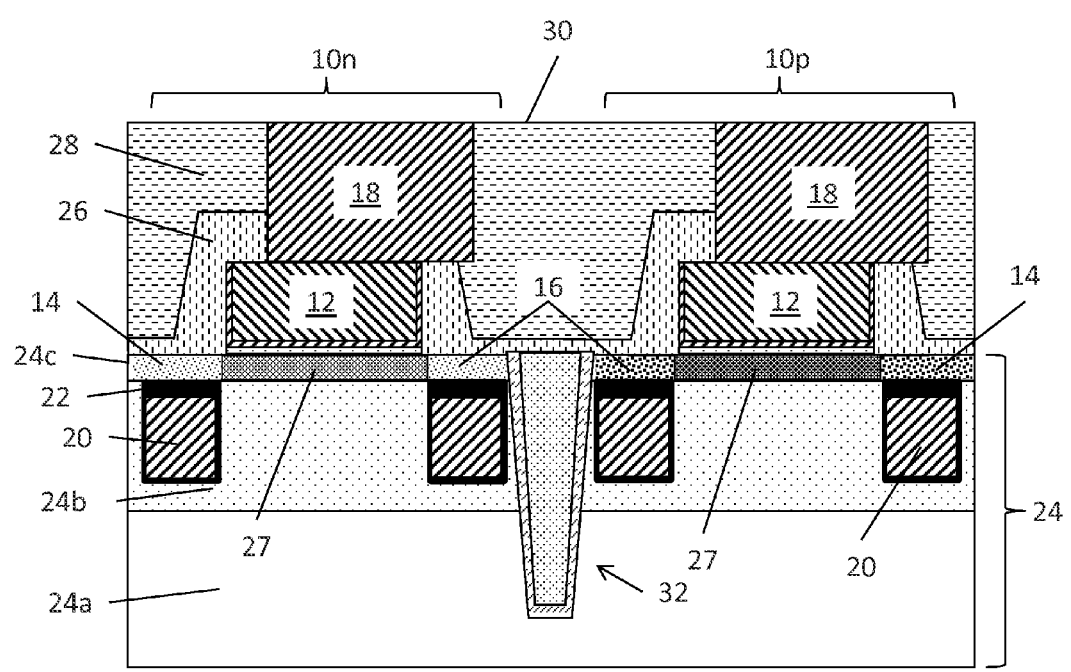

Reference is now made to FIGS. 8A and 8B which illustrate different gate contact configurations. It will be noted that the buried source and drain contact configuration is advantageous with aggressively scaled transistor configurations because space need not be provided above the transistor to permit the formation of the source/drain contact structure. In this regard, even with aggressively scaled transistor configurations, the gate contact can be sized to be larger than the gate electrode itself. FIG. 8A illustrates such a configuration. The buried source and drain contacts further permit some misalignment between the gate contact and the gate electrode without concern for shorting to the source or drain contact. FIG. 8B illustrates such a configuration.

Figure 9:
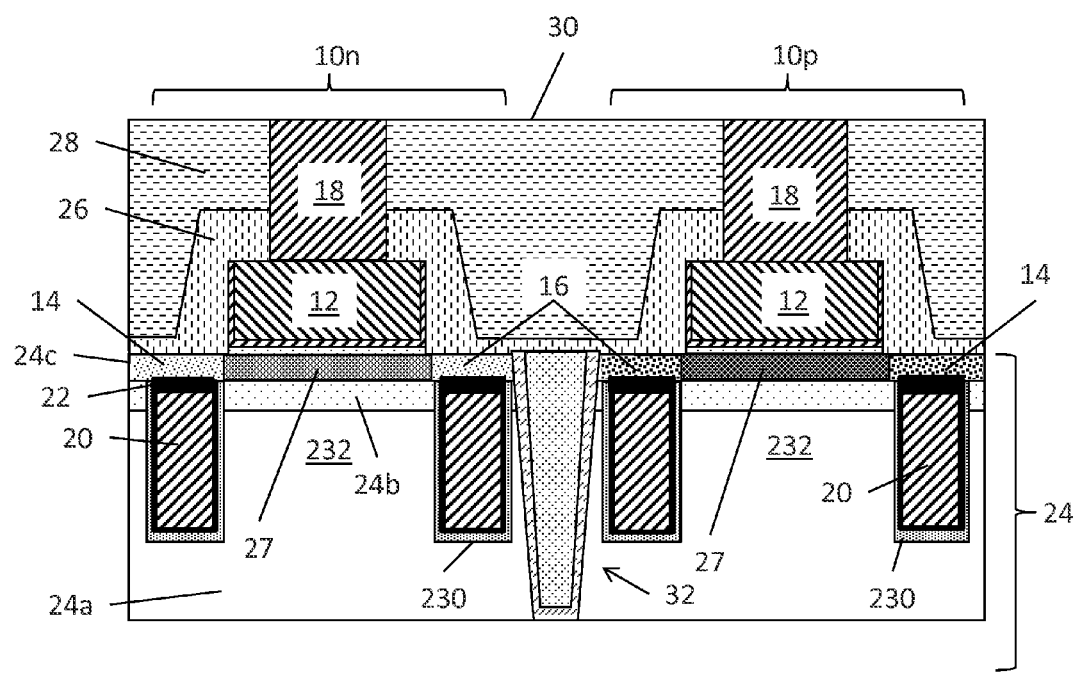
FIG. 9 is a cross-sectional diagram of a plurality of transistors which utilize a backside contact made to the transistor source-drain regions.

Reference is now made to FIG. 9 which illustrates a cross-sectional diagram of a plurality of transistors utilizing a backside contact made to the transistor source-drain regions. Like reference numbers refer to like or similar parts as shown in FIGS. 1, 3, 5 and 7 and will not be further described. The transistors of FIG. 9 differ from the transistors of FIGS. 1, 3, 5 and 7 in that the SOI substrate is instead of the ultra-thin body and buried oxide (UTBB) type and thus the buried source-drain contacts 20 are surrounded by an insulating layer 230 to isolate the buried source-drain contacts 20 from the semiconductor substrate layer 24a.

Reference is now made to FIGS. 10A-10E which illustrate process steps for forming the integrated circuit shown in FIG. 9.

Figure 10A:
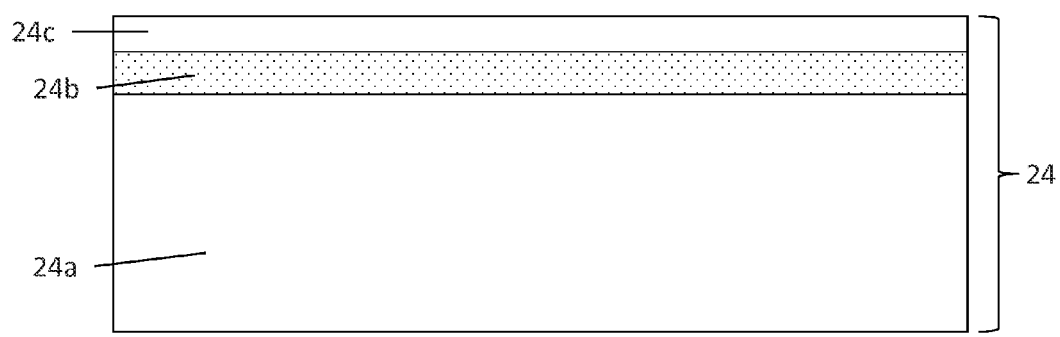
FIGS. 10A-10E illustrate alternative process steps for forming the integrated circuit shown in FIG. 9.
Figure 10B:
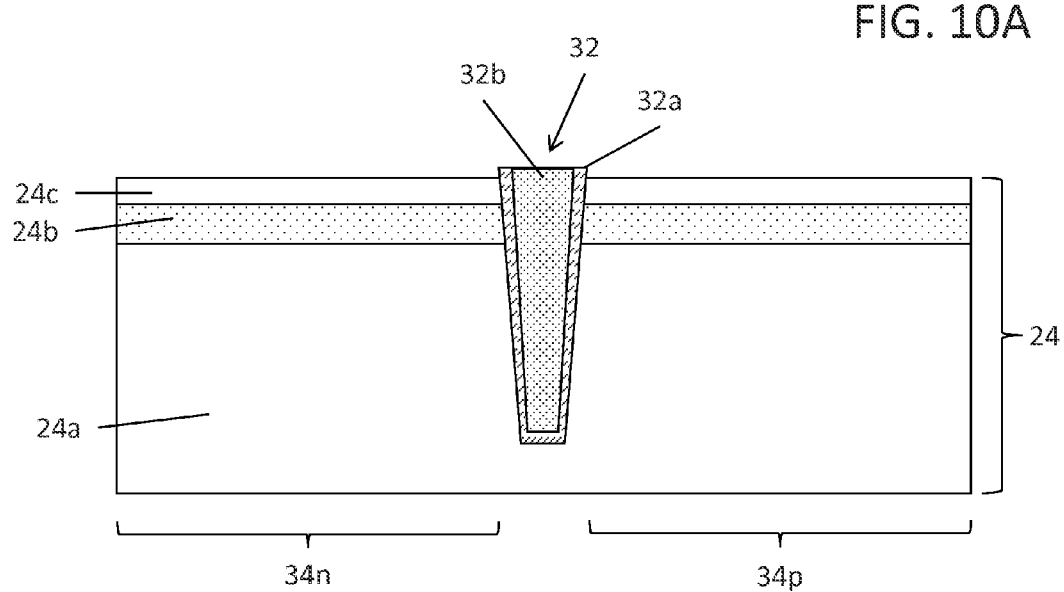

FIG. 10A shows a silicon on insulator (SOI) substrate 24 wafer of an ultra-thin body and buried oxide (UTBB) type. The substrate wafer 24 comprises a top semiconductor layer 24c over an insulating (for example, made of silicon dioxide) layer (BOX) 24b over a bottom semiconductor substrate layer 24a. The top semiconductor layer 24c may have a thickness of about 5 nm to 10 nm, the insulating layer 24b may have a thickness of about 10 nm to 40 nm, and the bottom semiconductor substrate layer 24a may have a thickness of about 100 microns to 800 microns. The top semiconductor layer 24c and bottom semiconductor substrate layer 24a may be doped as appropriate for the integrated circuit application. The thickness of the top and bottom semiconductor layers 24c and 24a may be tuned (for example, through the use of a thinning or epitaxy operation) as needed for the integrated circuit application. The top semiconductor layer 24c may, in a preferred embodiment, have a fully depleted (FD) configuration (although a partially depleted layer is also a possibility for some applications).

Using fabrication techniques well known to those skilled in the art, shallow trench isolation (STI) structures 32 are formed in the substrate 24 so as to divide the substrate 24 wafer into a plurality of active regions 34 (for example, an active region 34n for fabrication of circuits of a first conductivity type and an active region 34p for fabrication of circuits of a second conductivity type. The result of the STI structure fabrication is shown in FIG. 11B. The STI structure 32 is formed in a trench that has been etched into the substrate 24 (for example, extending completely through the top semiconductor layer 24c and insulating layer 24b and further extending at least partially through the bottom semiconductor substrate layer 24a. The trench is then lined with a liner 32a and filled by an insulating fill material 32b. The liner 32a may be made of SiN and the insulating fill material 32b may comprise $SiO_2$.

Figure 10C:
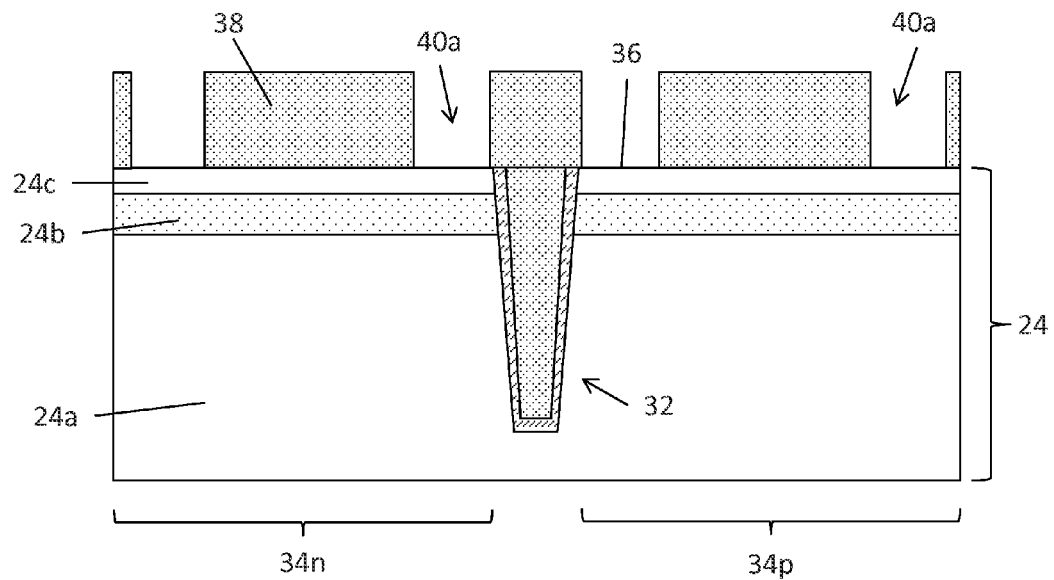
Figure 10D:
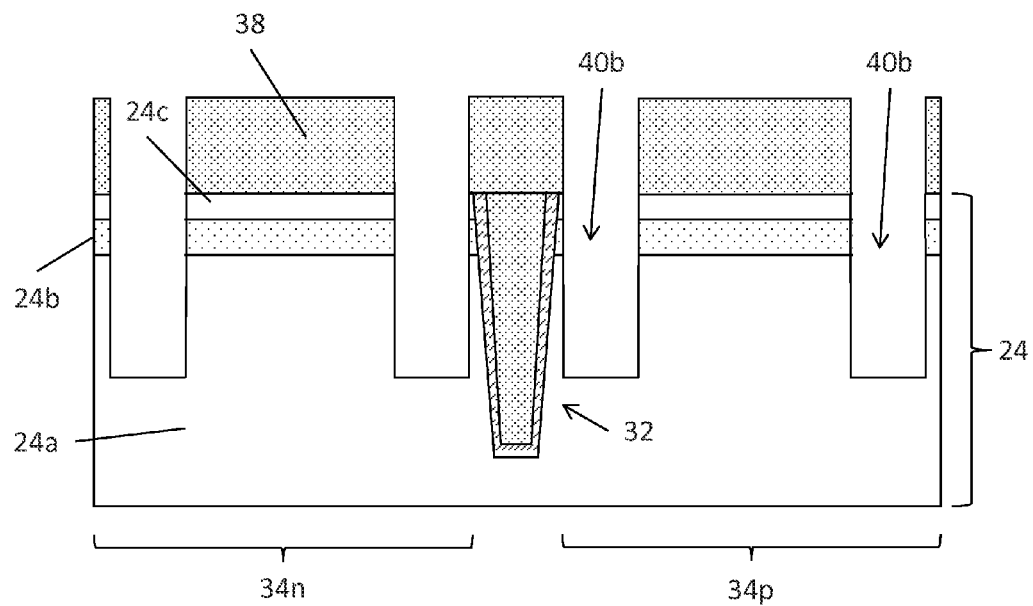
Figure 10E:
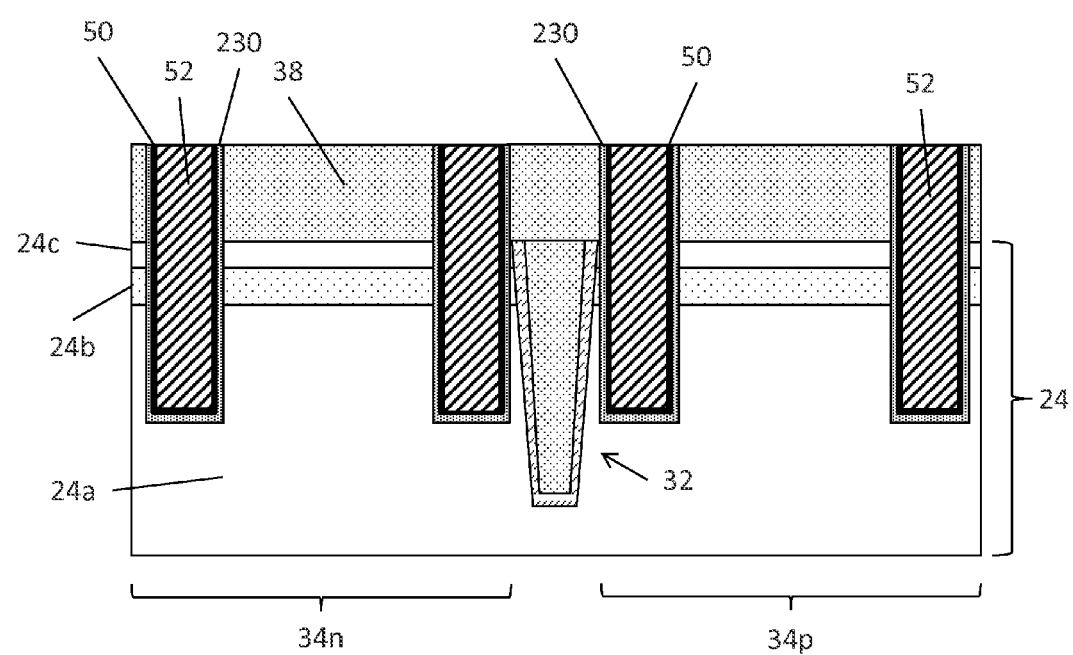

A patterned mask 38 is then formed on a top surface 36 of the wafer. The mask 38 includes a number of openings 40a which correspond to the locations where source-drain contacts 20 (see, FIG. 9) are to be formed. The material used for the patterned mask 38 may, for example, comprise a thermal $SiO_2$ material that is patterned using a lithographic etch technique in a manner well known to those skilled in the art. The result is shown in FIG. 10C.

A highly direction etch as known in the art is then used with the mask 38 to etch openings 40b which extend completely through the semiconductor layer 24c and completely through the insulator layer 24b of the substrate 24 and further partially into the bottom semiconductor substrate layer 24a. The result of the etch process is shown in FIG. 11D.

The openings 40b are then lined with an insulating liner 230, followed by a metal liner 50 and then filled with a metal material 52. The insulating liner 230 may comprise an insulating material such as SiN. The liner 50 may comprise TiN or TiC and the metal conductor material 52 may comprise W. The line and fill operations may be performed using a chemical vapor deposition (CVD) process, as known in the art. The result of this deposition may produce material from the liners and fill material covering the mask 38. A chemical-mechanical polishing (CMP) operation is performed to remove the materials down to the level of the mask 38. The result of the fill and polish process is shown in FIG. 11E.

At this point, the fabrication process continues with FIGS. 2F to 2Q so as to produce the integrated circuit shown in FIG. 9. The fabrication process steps of FIGS. 2F-2Q are incorporated by reference to follow the fabrication process steps of FIGS. 11A-11E.

The process make further including thinning the bottom semiconductor substrate layer 24a to the level of the bottom of the shallow trench isolation structures. This will result in an isolation of the bottom semiconductor substrate layer 24a in each of the active regions 34. The isolated bottom semiconductor substrate layer 24a may then be contacted, for example is then manner known in the art for biasing a well, to provide for a backside gate region 232 for each transistor.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An integrated circuit transistor, comprising:
   a substrate including an insulating layer and an overlying semiconductor layer, the substrate including a trench extending into the insulating layer;
   a metal material at least partially filling the trench in the insulating layer to form a source contact buried in the substrate, said source contact having a top surface;
   a source region formed by the overlying semiconductor layer and in electrical contact with the source contact, said source region having a bottom surface in physical contact with the top surface of the source contact;
   a channel region in the overlying semiconductor layer adjacent the source region;
   a gate dielectric on top of the channel region; and
   a gate electrode on top of the gate dielectric.

2. The transistor of claim 1, wherein the substrate comprises a silicon on insulator (SOI) substrate further including a base substrate layer under the insulating layer.

3. The transistor of claim 2, wherein the SOI substrate is of the ultra-thin body and buried oxide (UTBB) type.

4. The transistor of claim 3, wherein the trench extends through the insulating layer and into the base substrate layer.

5. The transistor of claim 4, wherein the source contact further comprises a layer of insulating material surrounding the source contact and isolating the source contact from both the insulating layer and the base substrate layer.

6. The transistor of claim 2, further including shallow trench isolation structures isolating an active region for the transistor, and wherein the base substrate layer in the active region forms a backside gate for the transistor.

7. The transistor of claim 1, wherein the top surface of the source contact comprises a silicide region.

8. The transistor of claim 1, wherein the source contact further comprises a layer of dielectric material surrounding the source contact and isolating the source contact from the insulating layer.

9. The transistor of claim 8, wherein the source contact forms a first electrode of a capacitor and the layer of dielectric material forms a dielectric of said capacitor.

10. The transistor of claim 1, wherein the gate electrode comprises side surfaces, and wherein the gate dielectric is not present on the side surfaces of the gate electrode.

11. The transistor of claim 1, wherein the channel region and the source region are formed of different epitaxially grown semiconductor materials.

12. The transistor of claim 1, wherein the substrate has a bottom surface and further comprising a conductive element extending into the substrate from the bottom surface.

13. The transistor of claim 12, wherein the conductive element is one of a thermal dissipator or an electrical contact.

14. The transistor of claim 13, wherein the electrical contact is positioned adjacent the channel region.

15. The transistor of claim 13, wherein the electrical contact is positioned adjacent the source contact.

16. The transistor of claim 15, wherein the source contact further comprises a layer of dielectric material surrounding the source contact and isolating the source contact from the insulating layer.

17. The transistor of claim 16, wherein the source contact forms a first electrode of a capacitor, the layer of dielectric material forms a dielectric of said capacitor and the electrical contact forms a second electrode of said capacitor.

18. The transistor of claim 1, wherein said substrate comprises a silicon on insulator (SOI) substrate further including a base substrate layer under the insulating layer, and wherein said trench extends through the insulating layer and into the base substrate layer.

19. The transistor of claim 18, wherein the source contact further comprises a layer of dielectric material surrounding the source contact and isolating the source contact from the insulating layer and the base substrate layer.

20. The transistor of claim 19, wherein the source contact forms a first electrode of a capacitor, the layer of dielectric material forms a dielectric of said capacitor and the base substrate layer forms a second electrode of said capacitor.

21. The transistor of claim 1, further comprising a gate contact extending from above the gate electrode to make electrical contact with the gate electrode.

22. The transistor of claim 21, wherein the gate contact laterally extends beyond the gate electrode.

23. The transistor of claim 21, the gate contact laterally extends beyond the gate electrode to a position vertically over the source region.

24. An integrated circuit, comprising:
a substrate including a trench;
a metal material at least partially filing said trench to form a source contact within the substrate, said source contact having a top surface;
an epitaxial semiconductor material source region having a bottom surface in a junction contact with the top surface of the source contact;
an epitaxial semiconductor material channel region located adjacent the epitaxial semiconductor material source region;
a gate dielectric over the channel region; and
a gate electrode over the gate dielectric.

25. The integrated circuit of claim 24, wherein the substrate comprises a silicon on insulator (SOI) substrate including insulator layer between a base substrate layer and a semiconductor layer, wherein the epitaxial semiconductor material source region is epitaxially grown from the semiconductor layer and wherein the epitaxial semiconductor material channel region is epitaxially grown from the semiconductor layer, and wherein the trench has a depth which extends through the semiconductor layer and into the insulator layer.

26. The integrated circuit of claim 25, wherein the depth of the trench further extends through the semiconductor layer and the insulator layer and into the base substrate layer.

27. The integrated circuit of claim 26, further comprising a layer of dielectric material surrounding the source contact so as to isolate the source contact from both the insulator layer and the base substrate layer.

28. The integrated circuit of claim 24, further comprising a silicide region at the top surface of the source contact, said bottom surface of the epitaxial semiconductor material source region in contact with the silicide region.

29. The integrated circuit of claim 24, further comprising a layer of dielectric material surrounding the source contact so as to isolate the source contact from the substrate.

30. The integrated circuit of claim 29, further comprising a capacitor having the source contact as a first electrode and the layer of dielectric material as a capacitor dielectric.

31. The integrated circuit of claim 24, wherein the substrate has a bottom surface and further comprising a conductive element extending into the substrate from the bottom surface.

32. The integrated circuit of claim 24, further comprising a gate contact extending from above the gate electrode to make electrical contact with the gate electrode.

33. The integrated circuit of claim 32, wherein the gate contact laterally extends beyond the gate electrode.

* * * * *